United States Patent
Porter et al.

Patent Number: 6,088,278
Date of Patent: Jul. 11, 2000

[54] LATCHING SENSE AMPLIFIER STRUCTURE WITH PRE-AMPLIFIER

[75] Inventors: John D. Porter; William N. Thompson, both of Meridian, Id.

[73] Assignee: Micron Technology, Inc., Boise, Id.

[21] Appl. No.: 09/121,145

[22] Filed: Jul. 23, 1998

[51] Int. Cl.[7] ................................... G11C 7/00
[52] U.S. Cl. ..................... 365/208; 365/205; 327/57
[58] Field of Search ........................ 365/205, 207, 365/208, 190; 327/52, 55, 57

[56] References Cited

U.S. PATENT DOCUMENTS

| | | | |
|---|---|---|---|
| 4,991,141 | 2/1991 | Tran | 365/207 |
| 5,640,356 | 6/1997 | Gibbs | 365/207 |
| 5,684,750 | 11/1997 | Kondoh et al. | 365/205 |
| 5,696,726 | 12/1997 | Tsukikawa | 365/205 |
| 5,706,236 | 1/1998 | Yamamoto | 365/205 |
| 5,768,202 | 6/1998 | Raad | 365/207 |
| 5,936,897 | 8/1999 | Koga | 365/190 |

*Primary Examiner*—Son Mai
*Attorney, Agent, or Firm*—Williams, Morgan & Amerson, P.C.

[57] ABSTRACT

An apparatus and method for sensing the logical state stored in a memory cell includes a pre-amplifier and a latching sense amplifier. The pre-amplifier receives differential signals from a memory array, shifts the signals and amplifies the differential sufficiently for input to the latching sense amplifier. The gain realized through the pre-amplifier facilitates faster and more reliable sensing of the memory cell state. A method comprises receiving first and second signals representative of a logical state stored in a memory cell, pre-amplifying a difference between the first and second signals to produce third and fourth signals having a greater difference, and amplifying the greater difference to more quickly and reliably produce an output indicative of the logical state stored in the memory cell.

26 Claims, 5 Drawing Sheets

LATCHING SENSE AMPLIFIER STRUCTURE WITH PRE-AMPLIFIER

BACKGROUND OF THE INVENTION

1. Field of the Invention

This invention relates generally to a sense amplifier for an integrated circuit memory, and, more particularly, to a sense amplifier for a static random access memory (SRAM).

2. Description of the Related Art

Modern integrated circuit memory devices generally include high density memory arrays on the integrated circuit chip. The array contains many memory cells, each of which stores a bit of data. In dynamic random access memories (DRAMs), for example, each of the memory cells stores an electrical charge, the value of the electrical charge being indicative of the logical bit value stored in the cell. The absence of an electrical charge in the memory cell may indicate a logical 0, whereas the presence of an electrical charge in the memory cell may indicate a logical 1. In static random access memories (SRAMs), a memory cell may have two parts, a first part storing the logical value and the second part storing the logical complement.

The many memory cells in an integrated circuit memory device are typically arranged in an array having a number of intersecting rows and columns. One memory cell is normally associated with each intersection of a row and a column. Word lines, which correspond to rows in the array, are used to access the memory cells connected to that word line. Bit lines or complementary bit line pairs, which correspond to columns in the array, are used to interconnect memory cells to sense amplifiers where the presence or absence of an electrical charge in the memory cell can be detected. Row decoders and column decoders activate a selected word line and a selected bit line or bit line pair to access a particular memory cell as designated by an address input to the memory device.

As memory device technology has advanced, memory cells have generally become smaller, and the amount of electrical charge that can be stored in the cell has diminished. Consequently, the electrical charge differential between a logical 0 and a logical 1 has diminished. In addition, as memory arrays have grown larger, bit lines have grown longer, the number of memory cells coupled to a bit line has increased, and the capacitances associated with the bit lines have increased. As a result, when a memory cell is accessed so that its contents may be read, the charge or voltage differential it will induce on a pair of bit lines becomes very small. To detect this charge differential and thereby read the logical value stored in the memory cell, latching sense amplifiers have become commonplace.

In a general sense, a latching sense amplifier compares the charge on a bit line with the charge on what is commonly known as a complementary bit line and amplifies that differential. As the charge differential between a bit line and its associated complementary bit line grows smaller, the detection of that differential and the amplification of it becomes slower and less reliable. There is a need for sense amplifiers that can more quickly and more reliably read the contents of a particular memory cell notwithstanding the very small electrical charges associated with the memory cell.

The present invention is directed to overcoming, or at least reducing the effects of, one or more of the problems set forth above.

SUMMARY OF THE INVENTION

In one aspect of the present invention, an apparatus is provided for sensing a logical state stored in a semiconductor memory cell. The apparatus includes a pre-amplifier having first and second bit lines coupled to it. The first bit line is adapted to receive a signal from a memory cell in the device and to provide a first input to the pre-amplifier. This first input is indicative of the logical state stored in the memory cell. The second bit line is adapted to provide a second input to the pre-amplifier, this second input representing a reference or being indicative of the complement of the logical state stored in the memory cell. A latching sense amplifier is coupled to the pre-amplifier and receives third and fourth signals from the pre-amplifier, the third and fourth signals being indicative of the logical state stored in the memory cell. The latching sense amplifier produces an output to indicate the logical state stored in the memory cell.

In another aspect of the present invention, a pre-amplifier is used in conjunction with the a latching sense amplifier to sense the status of a memory cell. The pre-amplifier includes a first shifting transistor having a gate terminal coupled to receive a signal from a first bit line coupled to a first memory cell. The pre-amplifier also includes a second shifting transistor whose gate terminal is coupled to receive a signal from a second bit line. The pre-amplifier includes first and second steering transistors whose gate terminals are coupled to the source terminals of the first and second shifting transistors, respectively. First and second loads are coupled to the drain terminals of the first and second steering transistors, and a current source is coupled to the source terminals of the steering transistors. The pre-amplifier is adapted to shift the levels of the signals it receives from the first and second bit lines and to amplify a voltage difference between the shifted first and second signals.

In another aspect of the present invention, a method for sensing the logical state stored in a memory cell is provided. The method includes producing a first signal indicative of a logical state stored in a cell and producing a second signal that is a reference or represents a complement of the logical state stored in the memory cell. In a pre-amplifier, the difference between the first and second signals is amplified to produce third and fourth signals differing by an amount greater than the difference between the first and second signals. In a latching sense amplifier, further amplification of the difference between the third and fourth signals occurs to produce an output indicative of the logical state stored in the memory cell.

BRIEF DESCRIPTION OF THE DRAWINGS

The invention may be understood by reference to the following description taken in conjunction with the accompanying drawings, in which like reference numerals identify like elements, and in which.

Figure 1:
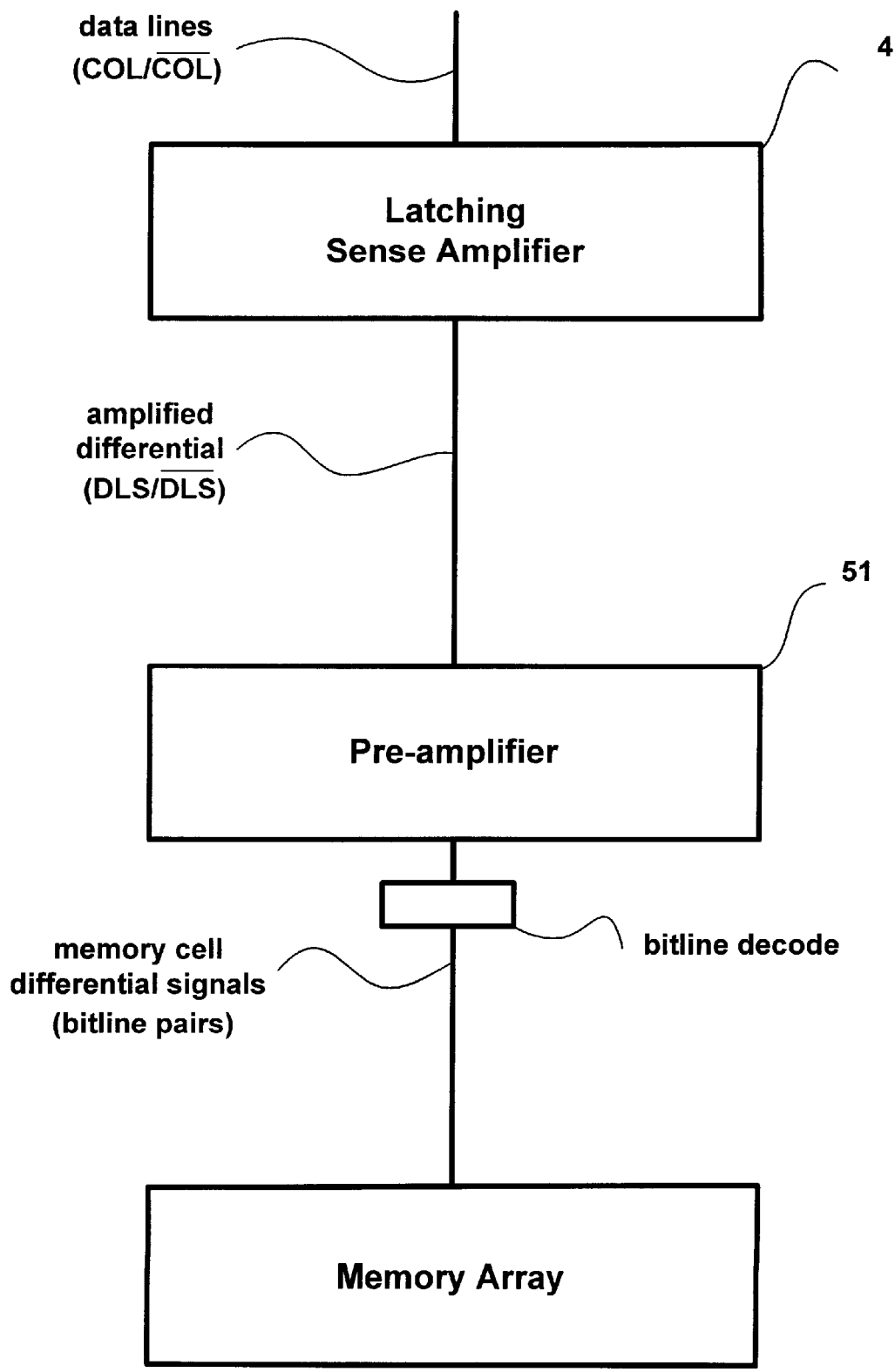
FIG. 1 is a block diagram illustrating a memory array, a pre-amplifier and a latching sense amplifier according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention includes a pre-amplifier used in conjunction with a latching sense amplifier, as well as a method for sensing and amplifying a differential voltage between two lines, for example, between a bit line and its complementary bit line, in an integrated circuit memory device.

FIG. 1 is a block diagram showing a memory array, a pre-amplifier 51 and a latching sense amplifier 41 arranged according to the present invention. The memory array includes memory cells that may be coupled, by bit lines, to the pre-amplifier 51, where a small differential voltage between the bit lines is amplified and input to the latching sense amplifier 41. The latching sense amplifier 41 receives the amplified voltage differential from the pre-amplifier 51, latches, and further amplifies the differential. The output from the latching sense amplifier 41 is indicative of the logical contents of the memory cell coupled to the pre-amplifier 51 and latching sense amplifier 41.

Figure 2:
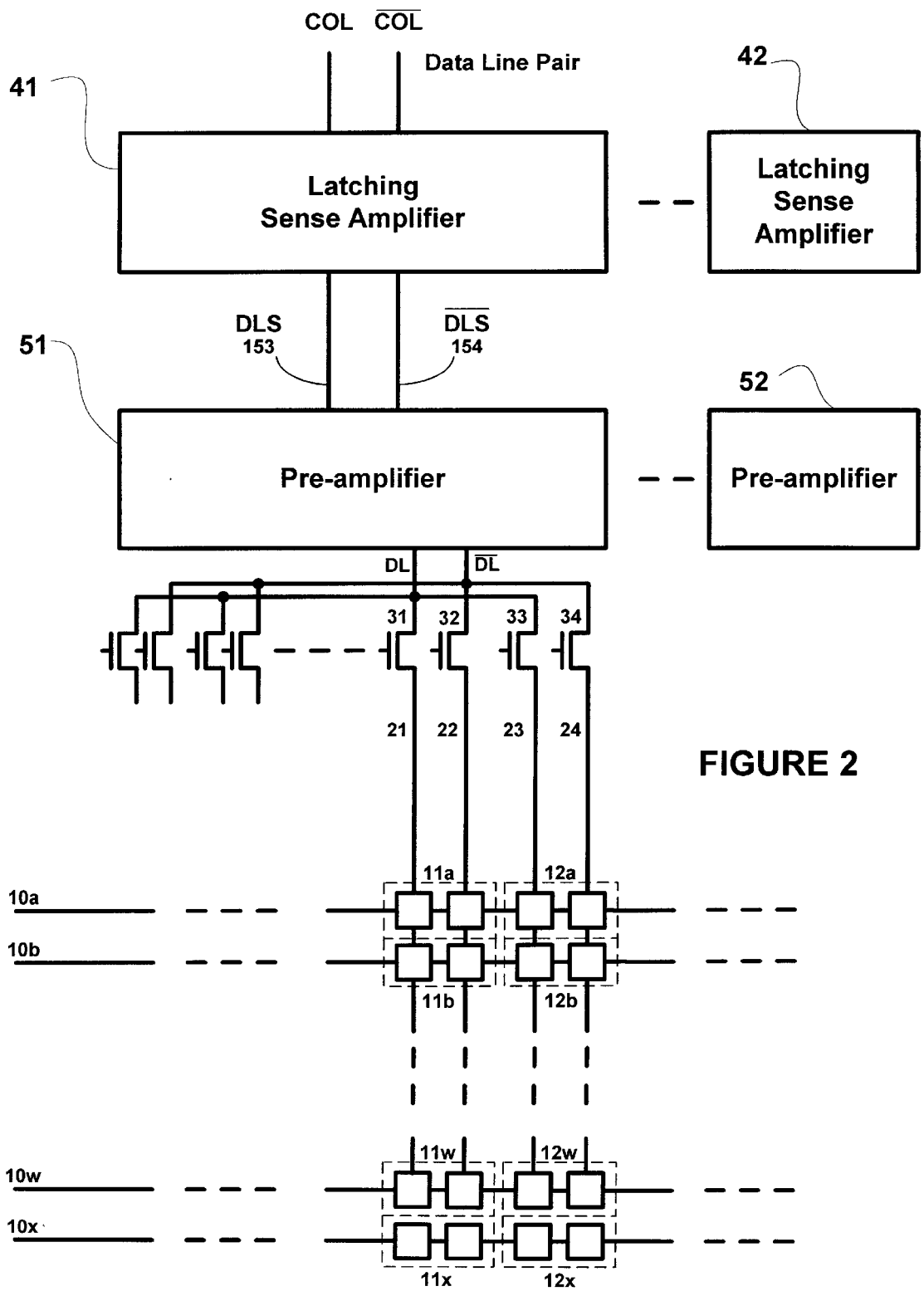
FIG. 2 is a block diagram showing a portion of a memory array and its interconnection with the pre-amplifier and latching sense amplifier.

FIG. 2 is a block diagram illustrating a portion of a static random access memory (SRAM) array and its interconnection with one particular pre-amplifier 51 and latching sense amplifier 41. An SRAM is one type of memory device in which the present invention will be useful. A collection of memory cells 11a through 11x, 12a through 12x . . . etc. are arranged in a series of rows and columns in the memory array. As illustrated in FIG. 2, each SRAM cell 11a–11x, 12a–12x, etc., comprises two parts for storing a logical value as well as the complement of that logical value. A word line 10a intersects the memory cells 11a, 12a, . . . etc. in a row of the memory array. Likewise, a word line 10b intersects the memory cells 11b, 12b, . . . etc. in another row of the memory array. A bit line 21 and a complementary bit line 22 intersect the memory cells 11a, 11b . . . etc. in one column of the memory array. A bit line 23 and a complementary bit line 24 intersect the memory cells in another column, namely the memory cells 12a, 12b . . . etc. A pre-amplifier 51 may be selectively coupled to the bit lines 21 and 22 by access transistors 31 and 32, respectively. Pre-amplifier 51 and sense amplifier 41 may, alternatively, be coupled to bit lines 23 and 24 by access transistors 33 and 34, respectively. Selection of bit line pairs by the use of decoding circuitry is well known in the art.

To select a memory cell for reading, row decoders (not shown), responding to address signals, will activate a selected word line, for example, word line 10a. Each of the memory cells connected to that word line will be connected to their respective bit line pair. Column decoders (not shown) will also respond to address signals to activate a selected pair of bit line access transistors, for example, bit line access transistors 31 and 32. The use of row and column decoders and the selection of a memory cell for reading by a sense amplifier, as generally described herein and illustrated in FIG. 2, is well understood by those of ordinary skill in the art.

When reading the contents of memory cell 12a, for example, pre-amplifier 51 will be connected to bit lines 23 and 24 through transistors 33 and 34. Because the memory cell 12a has been selected (by activation of word line 10a in conjunction with the selection of bit lines 23 and 24), memory cell 12a will be connected to bit line pair 23, coupling the memory cell logical value to one of the bit lines, for example, bit line 23, and the complement of that logical value to the other bit line, for example, bit line 24. As a result, a charge or voltage differential will exist between bit lines 23 and 24, and the pre-amplifier 51 will detect that charge or voltage differential. The pre-amplifier 51 will amplify the differential and deliver output signals to the latching sense amplifier 41. Latching sense amplifier 41 will further amplify the differential and deliver output signals on a data line pair. As suggested in FIG. 2, additional pre-amplifiers and sense amplifiers may be selectively coupled to other bit line pairs by means of their respective access transistors. Each of these additional pre-amplifier/sense amplifier pairs will detect a charge or voltage differential between the selected bit line pair and amplify that differential for output on a data line pair.

Figure 3:
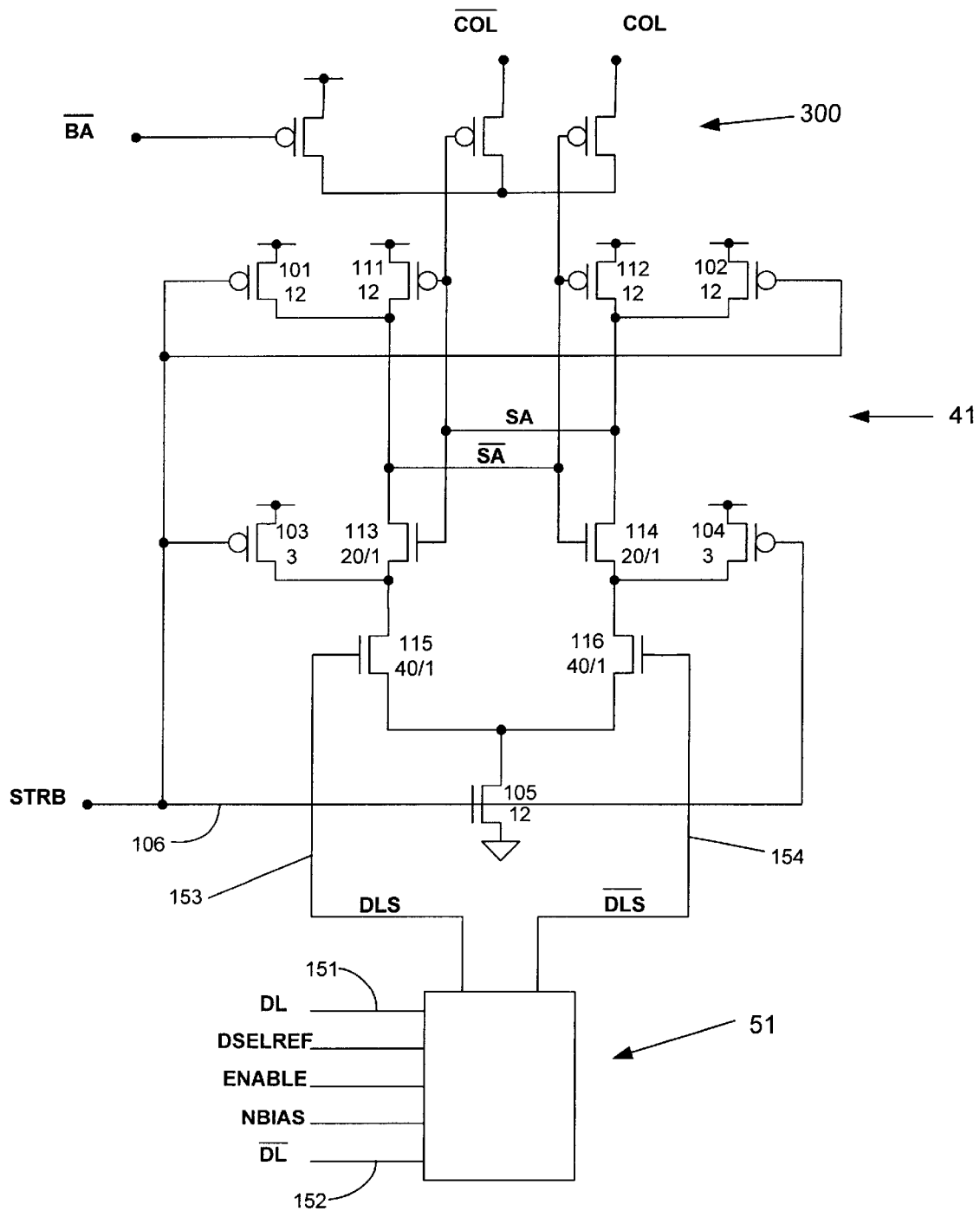
FIG. 3 shows one embodiment of a latching sense amplifier that may be used in accordance with the present invention.

FIG. 3 shows one embodiment of a latching sense amplifier 41 that may be used in the present invention. A cross-coupled latch comprises transistors 111, 112, 113 and 114. In the embodiment of FIG. 3, the transistors 111 and 112 are p-channel transistors, whereas the transistors 113 and 114 are n-channel transistors. The sense amplifier 41 in FIG. 3 also includes pre-charge transistors 101, 102, 103 and 104. Each of those four pre-charge transistors 101–104 is a p-channel transistor. A strobe signal, STRB, on a line 106 is connected to the gate terminals of the pre-charge transistors 101, 102, 103 and 104. The sense amplifier's pre-charge period begins when the STRB signal goes to a low voltage level. At that time, the pre-charge transistors 101, 102, 103 and 104 each connect a voltage Vcc to selected points in the sense amplifier circuitry. The pre-charge transistors 101 and 102 charge nodes $\overline{SA}$ and SA, respectively. The pre-charge transistors 103 and 104 charge the source terminals of the transistors 113 and 114 of the cross-coupled latch.

The latching sense amplifier 41 in FIG. 3 includes transistors 115 and 116, whose gate terminals are connected to receive signals DLS and $\overline{DLS}$ from the pre-amplifier 200. As will be more fully discussed below, the pre-amplifier 51 receives signals DL and $\overline{DL}$, which are coupled to a bit line and a complementary bit line, respectively, from the memory array. For example, the signal DL in FIG. 3 may be coupled to the bit line 21 in FIG. 2 through the transistor 31, and signal $\overline{DL}$ in FIG. 3 may be coupled to the bit line 22 in FIG. 2 through the transistor 32. The pre-amplifier 51 receives the signals DL and $\overline{DL}$ and amplifies a differential between those signals for input as the DLS and $\overline{DLS}$ signals to the latching sense amplifier 41 in FIG. 3.

Figure 5:
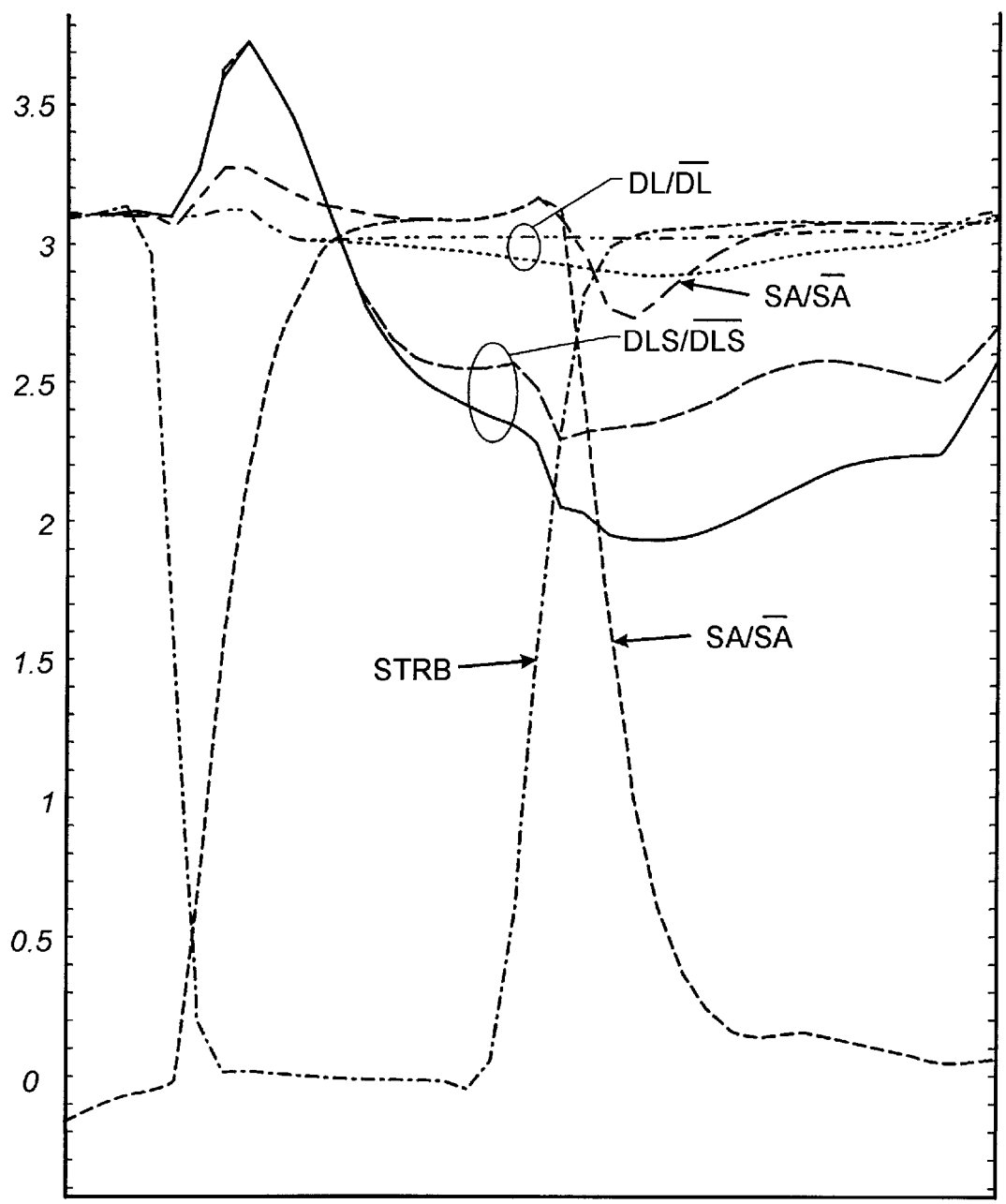
FIG. 5 is a diagram illustrating the relative timing of various signals associated with the latching sense amplifier and pre-amplifier shown in FIGS. 3 and 4, respectively.

The sensing and latching operations of the latching sense amplifier 41 illustrated in FIG. 3 will be well understood by those of ordinary skill in the art. In the pre-charge phase of the operation of the latching sense amplifier 41, the pre-charge transistors 101, 102, 103 and 104 are biased on to pre-charge their respective nodes as indicated above. In addition, because the STRB signal is low during pre-charge, the transistor 105 is turned off. As illustrated in FIG. 5, at the beginning of the latching sense amplifier pre-charge phase, there is little or no voltage differential between the signals DLS and $\overline{\text{DLS}}$. By the end of the pre-charge period, the signals DL and $\overline{\text{DL}}$ have begun to differ in voltage as a result of a memory cell having been coupled to the bit line pair. Also, by the end of the pre-charge period, the pre-amplifier 51 has amplified that voltage differential, and the amplified differential has appeared between DLS and $\overline{\text{DLS}}$. Thus, by the end of the latching sense amplifier pre-charge period, the voltages on the gates of the transistors 115 and 116 differ.

At the end of the pre-charge period, the STRB signal at line 106 goes to a relatively high voltage level. This action turns off the pre-charge transistors 101, 102, 103 and 104. In addition, the pull-down transistor 105 is biased on. When the transistor 105 conducts, the drain nodes of the transistors 115 and 116 begin to drop in voltage. Because the voltages on the gates of the transistors 115 and 116 are different, the transistor having the higher gate voltage will begin to conduct first, causing its drain terminal to begin to drop in voltage. Because the nodes SA and $\overline{\text{SA}}$ have been pre-charged to a relatively high voltage level, the transistors 113 and 114 are biased on. As the drain voltage on the transistors 115 or 116 begins to drop initially, the transistors 113 or 114 will begin to conduct, one before the other, causing the drain voltage of the earlier-conducting transistor 113 or 114 to begin to drop. This action will result in a voltage differential between the nodes SA and $\overline{\text{SA}}$.

For purposes of illustration, it may be assumed that at the end of the pre-charge phase, the voltage level of the DLS signal is higher than the voltage level of the $\overline{\text{DLS}}$ signal. Under that circumstance, the transistor 115 begins to conduct before the transistor 116. The drain voltage of the transistor 115, therefore, begins to drop before the drain voltage on the transistor 116 begins to drop. The transistor 113 begins to conduct before the transistor 114, causing the drain voltage on the transistor 113 to begin to drop before the drain voltage on the transistor 114. As the drain voltage on the transistor 113 (node $\overline{\text{SA}}$) begins to drop, the transistor 114 tends to remain turned off and the transistor 112 tends to begin to conduct. The transistor 114 remaining turned off and the transistor 112 beginning to conduct causes the drain voltage of the transistor 114 (node SA) to remain at a relatively high voltage level. As the node SA remains relatively high, the transistor 113 continues to conduct and the transistor 111 continues to be turned off. The action of the transistor 113 remaining turned on and the transistor 111 remaining turned off causes node $\overline{\text{SA}}$ to drop in voltage more quickly. Thus, the cross-coupled action of the latching sense amplifier 100 amplifies the voltage differential first appearing on the DLS and $\overline{\text{DLS}}$ signals and outputs that amplified differential on the nodes SA and $\overline{\text{SA}}$.

Figure 4:
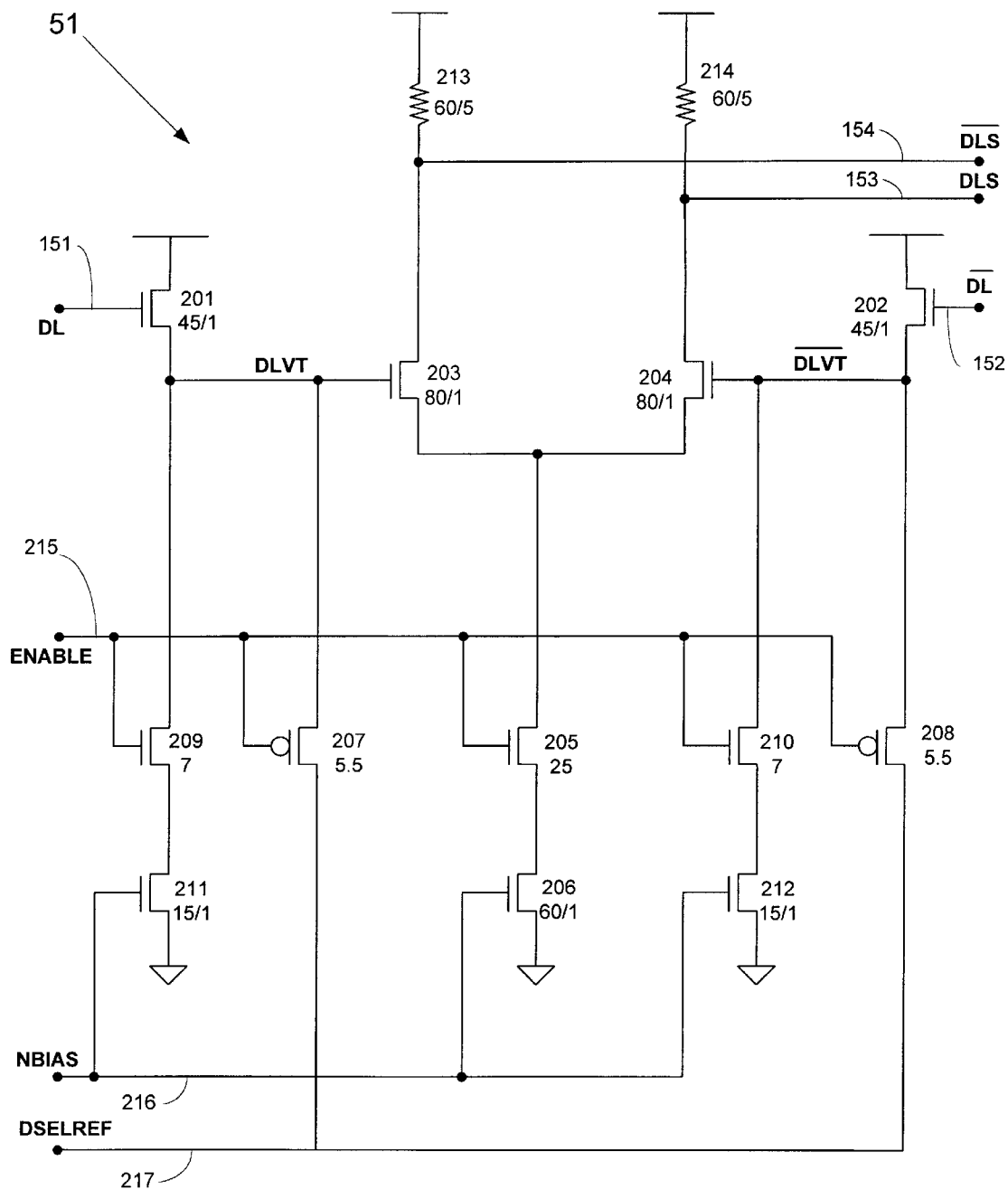
FIG. 4 shows one embodiment of a pre-amplifier that may be used in accordance with the present invention.

FIG. 4 illustrates one embodiment of a pre-amplifier 51 of the present invention. Transistor sizes for one specific embodiment are noted in FIG. 4. The pre-amplifier 51 includes steering devices 203 and 204 which are source-coupled n-channel transistors. The pre-amplifier 51 also includes load devices 213 and 214. In one embodiment of the pre-amplifier 51, the load devices 213 and 214 are implemented as n-well resistors in a p-type substrate. In that embodiment, the loads 213 and 214 each have values of approximately 3.96 k ohms to 4.0 k ohms. The load devices 213 and 214 may be implemented in a variety of other ways, including, for example, gate-grounded p-channel devices, polysilicon resistors, or other devices known to those of ordinary skill in the art to act as loads. The pre-amplifier 51 also includes transistors 205 and 206. The transistor 206 acts as a current source for the pre-amplifier 51.

The pre-amplifier 51 in FIG. 4 also includes shifter transistors 201 and 202, which are coupled at their gate terminals to be receive signals DL and $\overline{\text{DL}}$ over lines 151 and 152, respectively. The signals DL and $\overline{\text{DL}}$ represent signals coupled to the bit lines in the memory array, for example, the bit lines 21 and 22 shown in FIG. 2. In one device in which the present invention may be employed, decoding is used to select one bit line pair from eight possible pairs for input to the pre-amplifier 51 shown in FIG. 4. Multiple instantiations of the pre-amplifier 51 would typically be employed in the integrated circuit memory device.

Also used in conjunction with the pre-amplifier 51 are pull-down transistors 209, 210, 211 and 212 shown in FIG. 4. The transistors 209 and 211 are connected in series between the source node of the shifter transistor 201 and ground. The signal at the source node of the shifter transistor 201 is designated DLVT. The transistors 210 and 212 are connected in series between the source node of the shifter transistor 202 and ground. The signal at the source node of the shifter transistor 202 is designated $\overline{\text{DLVT}}$. Finally, p-channel transistors 207 and 208 are coupled between the source node of the shifter transistor 201 and the source node of the shifter transistor 202, respectively, and a reference voltage designated DSELREF.

The conducting or non-conducting status of the transistors 205, 207, 208, 209 and 210 is controlled by an ENABLE signal on a line 215. The conducting or non-conducting status of the transistors 206, 211 and 212 is controlled by a signal NBIAS on a line 216. The NBIAS signal is used to compensate for process variations that occur during formation of the load resistors 213 and 214. The NBIAS signal compensates for process variations to maintain a known IR drop across the load resistors 213 and 214.

Prior to enabling of the pre-amplifier 51, the ENABLE signal is at a relatively low voltage. Under those conditions, the transistors 205, 209 and 210 are non-conducting, and their drain terminals are isolated from ground. The transistors 207 and 208 are in a conducting state and, together with the shifter transistors 201 and 202, help maintain the DLVT and $\overline{\text{DLVT}}$ signals at a voltage level of Vcc minus approximately one threshold voltage (of the shifter transistors 201 and 202). Thus, the DLVT and $\overline{\text{DLVT}}$ signals are approximately one threshold voltage below the levels of the DL and $\overline{\text{DL}}$ signals. Since no current flows through the steering devices 203 and 204 (the transistor 205 is non-conducting), nodes DLS and $\overline{\text{DLS}}$ are at a voltage level of approximately Vcc.

When the pre-amplifier 51 is to be enabled, the ENABLE signal goes high, biasing on the transistors 205, 209 and 210, and turning off the transistors 207 and 208. Because the NBIAS signal is at its relatively high value (about 1.0 volt), the transistors 206, 211 and 212 are also biased on. Immediately after the ENABLE signal goes high to enable the pre-amplifier 51, there is little or no voltage differential between the DLVT and $\overline{\text{DLVT}}$ signals because there is little or no differential between the signals DL and $\overline{\text{DL}}$ signals. Therefore, immediately following the enabling of the pre-amplifier 51, current flow through the loads 213 and 214 is approximately equal. However, shortly after enabling the pre-amplifier 51, a voltage differential will begin to appear between the DL and $\overline{\text{DL}}$ signals because of the coupling of the selected memory cell to the bit line pair that has been coupled to the pre-amplifier 51 through the previously-mentioned decoding. As a voltage differential develops between the DL and $\overline{\text{DL}}$ signals, a differential will begin to develop between the DLVT and $\overline{\text{DLVT}}$ signals.

Because the DLVT and $\overline{\text{DLVT}}$ signals have been shifted downward from Vcc by the shifter transistors 201 and 202, the gate-to-source voltage on the steering devices 203 and 204 will be less than the drain-to-source voltage minus a threshold voltage. When the pre-amplifier 51 is enabled, the transistors 209 and 211 will cooperate to begin to pull the DLVT signal toward ground. At the same time, the transistors 210 and 212 will cooperate to begin to pull the $\overline{\text{DLVT}}$ signal toward ground. Also, the pull-down transistors 205 and 206 will begin to pull down the source terminals of the steering devices 203 and 204. The transistor 201 and the pair of transistors 209 and 211 will act as a voltage divider in pulling down on the DLVT signal, while the transistor 202 and the pair of transistors 210 and 212 will act as a voltage divider in pulling down on the $\overline{\text{DLVT}}$ signal. Because a voltage difference appears between the DL and $\overline{\text{DL}}$ signals, the voltage divider circuits generate a voltage difference between the DLVT and $\overline{\text{DLVT}}$ signals. This difference between the DLVT and $\overline{\text{DLVT}}$ signals alters the current flow through the load 213 and the transistor 203 as compared to the current flow through the load 214 and the transistor 204. Thus, one of those branches begins to conduct a larger proportion of the total current than does the other of the branches. As a voltage differential appears between the DLS and $\overline{\text{DLS}}$ signals, the current steering by the transistors 203 and 204 improves. The steering devices 203 and 204 will operate in their saturation regions, increasing the gain realized through the pre-amplifier 51. The gain through the pre-amplifier 51 can be modulated through adjustment of the value of the loads 213 and 214. Although the gain through the pre-amplifier 51 is non-linear, in the embodiment illustrated in FIG. 4, the gain through the pre-amplifier 51 is approximately three. Thus, a 30 mv differential between the DL and $\overline{\text{DL}}$ signals will result in an approximately 100 mv differential at the nodes DLS and $\overline{\text{DLS}}$, the inputs to the latching sense amplifier 41 illustrated in FIG. 3.

The pre-amplifier 51 illustrated in FIG. 4 need not include the shifter transistors 201 and 202, and a gain will nonetheless be realized through the pre-amplifier 51. Because of the gain achieved by use of the pre-amplifier 51, a voltage differential adequate to reliably latch the sense amplifier 41 in FIG. 3 can be more quickly realized. Thus, faster and more reliable sensing of the memory cell contents can be achieved.

FIG. 5 illustrates the relative timing and voltage levels of various signals associated with the pre-amplifier 51 of FIG. 4 and the latching sense amplifier 100 of FIG. 3. Shown in FIG. 5 is the strobe signal (STRB) for the latching sense amplifier, signals appearing on a bit line and complementary bit line (DL and $\overline{\text{DL}}$ respectively), the DLS and $\overline{\text{DLS}}$ signals that are outputs from the pre-amplifier 51, and the SA and $\overline{\text{SA}}$ signals that are outputs from the latching sense amplifier 41. As is readily apparent, a small voltage differential between DL and $\overline{\text{DL}}$ bit line pair from the memory array), although not sufficiently large to reliably latch the latching sense amplifier 41, is amplified at the output of the pre-amplifier 51. The amplified differential is further amplified and latched by the latching sense amplifier 41. The latching sense amplifier 41 is thereby latched more quickly and more reliably than is possible without the pre-amplifier 51.

Although the description above makes clear the present invention is useful in the context of a packaged integrated circuit memory device, the invention may also be implemented in conjunction with other known devices. For example, the invention may be embodied in an SRAM that is embedded in a microprocessor or any logic device. A video chip set device or a communication chip in which an SRAM component is included may also benefit by utilizing the present invention for sensing the contents of the SRAM cells. In general, any integrated circuit apparatus in which SRAM cells will store data may employ the present invention to advantage in reading the memory cells. Additionally, the present invention may be useful in other integrated circuit memory devices, for example, DRAMs. Although the specifics of memory cell selection in DRAMs differ from selection in SRAMs, and although the manner in which a charge or voltage differential is established on a bit line pair in a DRAM differs from the manner in which the differential is established in an SRAM, the principles of the present invention will apply equally to a DRAM device, as those of ordinary skill in the art will readily recognize. In like manner, the principles of the present invention will be applicable to a variety of integrated circuit memory devices and integrated circuit devices that include or incorporate memory cells.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit memory device, comprising:
    a pre-amplifier for receiving first and second inputs and amplifying a difference between the inputs, the pre-amplifier comprising:
        first and second source-coupled steering transistors;
        first and second loads coupled to drain terminals of the first and second steering transistors, respectively; and
        a current source coupled to the source terminals of the steering transistors wherein the amplified difference between the first and second inputs is provided as first and second pre-amplifier outputs;
    a first bit line selectively coupled to the pre-amplifier, the first bit line being capable of receiving a first signal from a memory cell and providing the first input to the pre-amplifier;
    a second bit line selectively coupled to the pre-amplifier, the second bit line being capable of providing the second input to the pre-amplifier; and
    a latching sense amplifier coupled to the pre-amplifier, the latching sense amplifier capable of receiving the first and second pre-amplifier outputs and producing an output indicative of the logical state stored in the memory cell.

2. The integrated circuit memory device of claim 1, wherein gate terminals of the first and second steering transistors are capable of receiving the first and second inputs, respectively.

3. The integrated circuit memory device of claim 1, wherein the pre-amplifier further comprises first and second shifting transistors having gate terminals for receiving the first and second inputs, respectively, and having source terminals coupled to gate terminals of the first and second steering transistors, respectively, for providing first and second shifted signals to the gate terminals of the first and second steering transistors, respectively.

4. An integrated circuit memory device, comprising:
first and second memory cells capable of storing first and second voltage signals, each memory cell having a cell access transistor;
a first bit line coupled to at least a first one of the cell access transistors;
a second bit line coupled to at least a second one of the cell access transistors;
decoding circuitry coupled to the first and second cell access transistors capable of selecting one of the first and second memory cells for reading;
a pre-amplifier coupled to and capable of receiving first and second voltage signals from the first and second bit lines, the pre-amplifier comprising:
first and second source-coupled steering transistors;
first and second loads coupled to drain terminals of the first and second steering transistors, respectively; and
a current source coupled to the source terminals of the steering transistors wherein the amplified difference between the first and second voltage signals is output as third and fourth voltage signals; and
a latching sense amplifier coupled to the pre-amplifier, the latching sense amplifier capable of receiving the third and fourth voltage signals and outputting fifth and sixth voltage signals, the fifth and sixth voltage signals being indicative of a logical status of the selected one of the first and second memory cells.

5. The integrated circuit memory device of claim 4, wherein the pre-amplifier further includes first and second shifting transistors coupled to receive the first and second voltage signals, respectively, and to produce a first shifted voltage signal and a second shifted voltage signal.

6. The integrated circuit memory device of claim 5, further comprising:
a first pull-down transistor operable to pull the first shifted voltage signal toward an electrical ground; and
a second pull-down transistor operable to pull the second shifted voltage signal toward the electrical ground.

7. A pre-amplifier for use in conjunction with a latching sense amplifier for sensing a status of a memory cell, comprising:
a first shifting transistor having a gate terminal coupled to receive a signal from a first bit line, the first bit line being coupled to a first memory cell;
a second shifting transistor having a gate terminal coupled to receive a signal from a second bit line;
first and second steering transistors having source terminals coupled, the first and second steering transistors having gate terminals coupled to source terminals of the first and second shifting transistors, respectively;
first and second loads coupled to drain terminals of the first and second steering transistors, respectively; and
a current source coupled to the source terminals of the steering transistors, the preamplifier being capable of amplifying a voltage difference between the first and second bit lines and providing the amplified difference at the drain terminals of the first and second steering transistors.

8. The pre-amplifier of claim 7, wherein the first and second loads each comprise a resistor formed by an n-well region in a p-type substrate.

9. The pre-amplifier of claim 7, wherein the first and second loads each comprise a resistor formed by a diffusion region in a p-type substrate.

10. The pre-amplifier of claim 7, wherein the first and second loads each comprise a resistor formed by a diffusion region in an n-well in a p-type substrate.

11. The pre-amplifier of claim 7, wherein the first and second loads each comprise a p-channel transistor having a gate terminal grounded.

12. The pre-amplifier of claim 7, wherein the first and second loads each comprise an n-channel transistor having a gate terminal coupled to a voltage supply.

13. The pre-amplifier of claim 7, wherein the first and second loads each comprise a polysilicon resistor.

14. The pre-amplifier of claim 7, wherein the steering transistors operate in a saturation region to amplify the voltage difference between the first and second bit lines.

15. A pre-amplifier for use in conjunction with a latching sense amplifier for sensing a status of a memory cell, comprising:
a first shifting transistor having a gate terminal coupled to receive a signal from a first bit line, the first bit line being coupled to a first memory cell;
a second shifting transistor having a gate terminal coupled to receive a signal from a second bit line;
a first pre-charge transistor coupled between the source terminal of the first shifting transistor and a reference voltage and a second pre-charge transistor coupled between the source terminal of the second shifting transistor and the reference voltage;
first and second steering transistors having source terminals coupled, the first and second steering transistors having gate terminals coupled to source terminals of the first and second shifting transistors, respectively;
first and second loads coupled to drain terminals of the first and second steering transistors, respectively; and
a current source coupled to the source terminals of the steering transistors, the preamplifier being capable of amplifying a voltage difference between the first and second bit lines and providing the amplified difference at the drain terminals of the first and second steering transistors.

16. The pre-amplifier of claim 7, further comprising:
a first pull-down transistor coupled between the source terminal of the first shifting transistor and ground, and
a second pull-down transistor coupled between the source terminal of the second shifting transistor and ground.

17. The pre-amplifier of claim 7, wherein the pre-amplifier exhibits a gain of approximately 3.

18. The pre-amplifier of claim 7, wherein a voltage difference of approximately 30 millivolts between the first and second signals is amplified by the pre-amplifier to approximately 100 millivolts.

19. In an apparatus, a sense amplifier for sensing logical states stored in memory cells embedded in the apparatus, the sense amplifier comprising:
a pre-amplifier for receiving a pair of signals from a pair of bit lines, a first one of the signals representing a logical state stored in a memory cell and a second one of the signals representing a complement of the logical state stored in the memory cell, the pre-amplifier comprising:
first and second source-coupled steering transistors;
first and second loads coupled to drain terminals of the first and second steering transistors, respectively; and a current source coupled to the source terminals of the steering transistors wherein the first and second signals is amplified to generate a first pair of output signals indicative of the logical state stored in the memory cell;

a latching sense amplifier for receiving the pair of output signals from the pre-amplifier, the latching sense amplifier being capable of providing a second pair of output signals for further indicating the logical state stored in the memory cell.

20. A method for sensing a logical state stored in a memory cell, comprising:

producing a first signal indicative of a logical state stored in the memory cell;

producing a second signal differing from the first signal;

in a pre-amplifier:
providing the first and second signals to first and second steering transistors, respectively;
amplifying the difference between the first and second signals by sinking current through at least one of first and second loads connected to drain terminals of the first and second steering transistors, respectively;
outputting third and fourth signals differing by an amount greater than the difference between the first and second signals; and in a latching sense amplifier, amplifying the difference between the third and fourth signals to produce an output indicative of the logical state stored in the memory cell.

21. The method of claim 20, further comprising
in the pre-amplifier, shifting the first signal from a first relatively higher level to a first relatively lower level and shifting the second signal from a second relatively higher level to a second relatively lower level.

22. The method of claim 21, further comprising:
in the pre-amplifier, pulling the first and second relatively lower levels toward an electrical ground.

23. The method of claim 21, wherein shifting the first signal from a relatively higher level to a relatively lower level and shifting the second signal from a relatively higher level to a relatively lower level comprises shifting the first and second signals before the voltage difference between the first and second signals is pre-amplified.

24. An integrated circuit memory device, comprising:
a pre-amplifier capable of receiving first and second inputs and amplifying a difference between the inputs, the pre-amplifier comprising:
a first shifting transistor having a gate terminal coupled to receive a signal from a first bit line, the first bit line being coupled to a first memory cell;
a second shifting transistor having a gate terminal coupled to receive a signal from a second bit line;

a first pre-charge transistor coupled between the source terminal of the first shifting transistor and a reference voltage and a second pre-charge transistor coupled between the source terminal of the second shifting transistor and the reference voltage;

a first bit line selectively coupled to the pre-amplifier, the first bit line being capable of receiving a first signal from a memory cell and providing the first input to the pre-amplifier;

a second bit line selectively coupled to the pre-amplifier, the second bit line being capable of providing the second input to the pre-amplifier; and a latching sense amplifier coupled to the pre-amplifier, the latching sense amplifier being capable of receiving the first and second pre-amplifier outputs and producing an output indicative of the logical state stored in the memory cell.

25. An integrated circuit memory device, comprising:
first and second memory cells for storing first and second voltage signals, each memory cell having a cell access transistor;
a first bit line coupled to at least a first one of the cell access transistors;
a second bit line coupled to at least a second one of the cell access transistors;
decoding circuitry coupled to the first and second cell access transistors for selecting one of the first and second memory cells for reading;
a pre-amplifier coupled to and receiving first and second voltage signals from the first and second bit lines, the pre-amplifier comprising:
a first shifting transistor having a gate terminal coupled to receive the first signal from the first bit line;
a second shifting transistor having a gate terminal coupled to receive the second signal from the second bit line;
a first pre-charge transistor coupled between the source terminal of the first shifting transistor and a reference voltage and a second pre-charge transistor coupled between the source terminal of the second shifting transistor and the reference voltage; and
a latching sense amplifier coupled to the pre-amplifier, the latching sense amplifier being capable of receiving the third and fourth voltage signals and outputting fifth and sixth voltage signals, the fifth and sixth voltage signals being indicative of a logical status of the selected one of the first and second memory cells.

26. The integrated circuit memory device of claim 4 wherein gate terminals of the first and second steering transistors are coupled to receive the first and second voltage signals, respectively.

* * * * *